United States Patent
Li et al.

(10) Patent No.: US 10,177,204 B2
(45) Date of Patent: Jan. 8, 2019

(54) METHOD FOR MANUFACTURING DISPLAY SUBSTRATE, DISPLAY SUBSTRATE AND DISPLAY DEVICE

(71) Applicant: BOE Technology Group Co., Ltd., Beijing (CN)

(72) Inventors: Wei Li, Beijing (CN); Youngsuk Song, Beijing (CN); Jingang Fang, Beijing (CN); Hongda Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1 day.

(21) Appl. No.: 15/235,458

(22) Filed: Aug. 12, 2016

(65) Prior Publication Data
US 2017/0200773 A1     Jul. 13, 2017

(30) Foreign Application Priority Data
Jan. 7, 2016   (CN) .......................... 2016 1 0009787

(51) Int. Cl.
*H01L 27/32*    (2006.01)
*H01L 51/56*    (2006.01)
*H01L 51/52*    (2006.01)

(52) U.S. Cl.
CPC ........ *H01L 27/3232* (2013.01); *H01L 27/322* (2013.01); *H01L 27/3246* (2013.01); *H01L 27/3262* (2013.01); *H01L 27/3272* (2013.01); *H01L 51/5284* (2013.01); *H01L 51/56* (2013.01); *H01L 2227/323* (2013.01)

(58) Field of Classification Search
CPC ............... H01L 27/3232; H01L 27/322; H01L 27/3246; H01L 27/3262; H01L 27/3272; H01L 51/56; H01L 2227/323
See application file for complete search history.

(56) References Cited

U.S. PATENT DOCUMENTS

| | | |
|---|---|---|
| 5,695,690 A | 12/1997 | Swirbel et al. |
| 2006/0063351 A1* | 3/2006 | Jain ...................... G02F 1/1362 438/455 |
| 2007/0085112 A1* | 4/2007 | Yamazaki ......... H01L 21/28008 257/288 |

(Continued)

FOREIGN PATENT DOCUMENTS

KR         100810645 B1     3/2008

OTHER PUBLICATIONS

May 9, 2018—(CN) Second Office Action Appn 201610009787.7 with English Translation.

*Primary Examiner* — Fernando L Toledo
*Assistant Examiner* — Neil Prasad
(74) *Attorney, Agent, or Firm* — Banner & Witcoff, Ltd.

(57) ABSTRACT

A method for manufacturing a display substrate, a display substrate and a display device are disclosed. The method includes: forming a thin-film transistor (TFT) array on a base substrate to form an array substrate; and forming a pixel define layer (PDL) on a non-pixel region of the array substrate by a patterning process. A photochromic material is uniformly distributed in the PDL; the PDL provided with the photochromic material can be converted from light-transmitting to light-shielding under action of light illumination; and the process that the PDL is converted from light-transmitting to light-shielding is irreversible.

14 Claims, 3 Drawing Sheets

(56) References Cited

U.S. PATENT DOCUMENTS

| | | | |
|---|---|---|---|
| 2007/0090751 A1* | 4/2007 | Cok | .................... H01L 27/3213 |
| | | | 313/501 |
| 2009/0130486 A1* | 5/2009 | Zhou | ...................... G02B 5/201 |
| | | | 428/702 |
| 2015/0053948 A1* | 2/2015 | Matsushima | ....... H01L 51/0004 |
| | | | 257/40 |
| 2015/0226890 A1* | 8/2015 | Jin | .......................... G02B 5/23 |
| | | | 359/242 |

* cited by examiner

METHOD FOR MANUFACTURING DISPLAY SUBSTRATE, DISPLAY SUBSTRATE AND DISPLAY DEVICE

This application claims priority to and the benefit of Chinese Patent Application No. 201610009787.7 filed on Jan. 7, 2016, which application is incorporated herein in its entirety.

TECHNICAL FIELD

Embodiments of the present disclosure relate to a method for manufacturing a display substrate, a display substrate and a display device.

BACKGROUND

Display devices such as liquid crystal displays (LCDs) and organic light-emitting diode (OLED) display devices have become more and more popular in people's lives. The display device generally comprises an array substrate and a color filter (CF) substrate which are cell-assembled together. In order to improve the display quality of the display device and avoid the problems of reduced aperture ratio and light leakage of the display device caused by misalignment produced during the cell-assembly of the array substrate and the CF substrate, a display substrate comprising both the array substrate and CF structure appears in response to the demand. The structure of the display substrate comprises the array substrate and the CFs formed on the array substrate. As the cell-assembly process of the array substrate and the CFs is eliminated, the problems of reduced aperture ratio and light leakage caused by misalignment can be avoided.

SUMMARY

Embodiments of the present disclosure relate to a method for manufacturing a display substrate, a display substrate and a display device.

An embodiment of the present disclosure provides a method for manufacturing a display substrate, comprising: forming a thin-film transistor (TFT) array on a base substrate to form an array substrate; and forming a pixel define layer (PDL) on a non-pixel region of the array substrate by a patterning process. A photochromic material is uniformly distributed in the PDL; the PDL provided with the photochromic material can be converted from light-transmitting to light-shielding under action of light illumination; and the process that the PDL is converted from light-transmitting to light-shielding is irreversible.

Another embodiment of the present disclosure provides a display substrate, comprising: an array substrate; and a pixel define layer (PDL) disposed on a non-pixel region of the array substrate. A photochromic material is uniformly distributed in the PDL, the PDL provided with the photochromic material can be converted from light-transmitting to light-shielding under action of light illumination, and the process that the property of the PDL is converted from light-transmitting to light-shielding is irreversible.

Still another embodiment of the present disclosure provides a display device comprising the above display substrate.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

It should be noted that in the present disclosure, the term "pixel region" in the following embodiments refers to an opening area of a pixel in the display device, namely a light-transmitting area; the term "non-pixel region" refers to an area except the opening area of the pixel in the display device, namely a light-shielding area, and the area includes a gap area between adjacent pixels, a bezel area, etc. A display area of the display substrate includes a pixel array and is surrounded by the bezel area.

The inventors have noted in research that the technology of directly forming color filters (CFs) on an array substrate will result in a complex layer structure of a display substrate and hence may reduce the aperture ratio of the display substrate to a certain degree.

First Embodiment

Because the preparation of color filters directly on the array substrate results in a complex layer structure of the display substrate and hence may reduce the aperture ratio to a certain degree, in order to avoid the problem, the inventors has conceived that: as a pixel define layer (PDL) on an array substrate is disposed in non-pixel regions of the array substrate and the black matrix (BM) of the CFs are also disposed in the non-pixel regions of the array substrate when the CFs are formed on the array substrate, a PDL with light-shielding property can be formed to have the light-shielding function and replace the BM, so that the BM can be removed from the array substrate, namely the BM is not required to be formed on the array substrate any more. On the basis of the disclosure concept, the inventors of the disclosure has also noted that: the PDL is generally formed by a patterning process, and the material of forming the PDL mainly includes light-transmitting photosensitive resin, so that light can run through the material of the PDL in a light exposure process, and hence a PDL pattern can be formed by process such as development. However, if the PDL with light-shielding property is to be formed, the material of forming the PDL should be a light-shielding material, but light cannot easily run through the light-shielding PDL material in the light exposure process, so that the light exposure process cannot be completely conducted, and hence the PDL pattern satisfying requirements cannot be formed easily.

The embodiment of the present disclosure provides a method for manufacturing a display substrate. The manufacturing method comprises: forming a thin film transistor (TFT) array on a base substrate to realize an array substrate. For instance, the base substrate may adopt a transparent glass substrate. The base substrate may be cleaned before the array substrate is formed. A PDL is formed on non-pixel regions of the array substrate by a patterning process, and a photochromic material is uniformly distributed in the formed PDL. The photochromic material has light-transmitting property without light illumination, while once it undergoes light illumination, the color of the photochromic material changes, and the photochromic material possesses light-shielding property after the color change. Moreover, the color change is irreversible. As the photochromic material is uniformly distributed in the PDL, the variation of the property of the photochromic material can result in the change of the property of the PDL. That is to say, under the action of light illumination, the property of the photochromic material is converted from light-transmitting to light-shielding, so that the property of the PDL provided with the photochromic material is converted from light-transmitting to light-shielding under the action of light illumination as well. Moreover, the process that the PDL provided with the photochromic material is converted from light-transmitting to light-shielding is irreversible. It should be understood that the PDL is configured to define adjacent pixels in a pixel array, so that the pixels can be correspondingly separated to form relatively independent structures and avoid interference between adjacent pixels.

In the method, as the photochromic material is light-transmitting without light illumination, in the light exposure process of the patterning process, as the material layer formed by the PDL material on the array substrate before light exposure is not subjected to light illumination, the photochromic material uniformly distributed in the material layer is light-transmitting. Thus, light can run through the material layer and the light exposure process can be conducted, and hence the PDL material covering the pixel regions can be removed in the development process and the PDL can have required pattern after the patterning process. Meanwhile, under the action of light illumination, the property of the retained photochromic material in the PDL can be converted from light-transmitting to light-shielding. The property of the photochromic material in the PDL can be converted into light-shielding by additional and secondary light illumination in the light exposure process of the patterning process or after the completion of the patterning process, so that the formed PDL can have light-shielding property and have light-shielding function to replace BM, and therefore can avoid the phenomenon of color contamination of adjacent pixels. Meanwhile, the process that the property of the PDL is converted from light-transmitting to light-shielding is irreversible, so the finally formed PDL is a light-shielding PDL.

As can be seen, in the method for manufacturing the display substrate provided by the embodiment, the light-shielding PDL can be formed by a patterning process. The light-shielding PDL can be adopted to replace the BM and have light-shielding function. Therefore, the BM is not required to be arranged on the display substrate, so that the layer structure of the display substrate can be simplified; the problem of reduced aperture ratio when the CFs are formed on the array substrate can also be avoided or alleviated; and the aperture ratio of the display substrate can be improved. Meanwhile, as the forming process of the BM in the display substrate is eliminated, the manufacturing process of the display substrate is simplified as well. As the aperture ratio of the display substrate is improved, the power consumption of the display device comprising the display substrate is also reduced.

In the embodiment, the material of forming the PDL may be negative photosensitive resin doped with the photochromic material and may also be positive photosensitive resin doped with the photochromic material.

Figure 1:
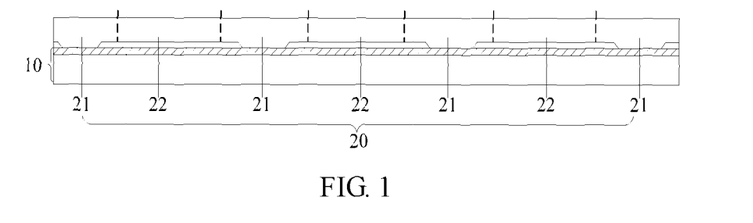
FIGS. 1 to 6 are flowcharts of a method for manufacturing a display substrate, provided by an embodiment of the present disclosure.

In the case that the material of forming the PDL is the negative photosensitive resin doped with the photochromic material, the process of forming the PDL, for instance, may include the following steps:

S1: as illustrated in FIG. 1, allowing the material of forming the PDL to cover an array substrate 10, and forming a material layer 20, in which the material layer 20 includes a first portion 21 and a second portion 22; the first portion 21 covers a non-pixel region of the array substrate 10; and the second portion 22 covers a pixel region of the array substrate 10.

In the step S1, when the material of forming the PDL is prepared, the photochromic material can be doped in the negative photosensitive resin and uniformly stirred, so that the photochromic material can be uniformly dispersed in the negative photosensitive resin. The photosensitive resin may preferably adopt photosensitive resin with high viscosity, good uniformity and high photosensitivity. The material layer 20 may be formed by allowing the prepared material of forming the PDL to cover the array substrate 10 by a spin-coating process. The thickness of the material layer 20, for instance, may be 1.0 µm-1.5 µm, so that the subsequently formed PDL can have good light-shielding property.

Figure 2:
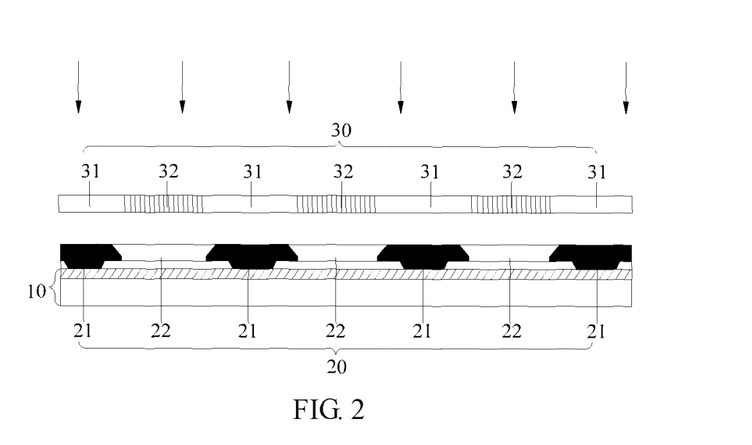

S2: as illustrated in FIG. 2, performing light exposure on the first portion 21 of the material layer 20, in which during exposure, the property of the first portion 21 of the material layer 20 is converted from light-transmitting to light-shielding, and the process that the property of the first portion 21 of the material layer 20 is converted from light-transmitting to light-shielding is irreversible.

In the step S2, the material layer 20 is subjected to exposure via a mask 30 provided with a PDL pattern corresponding to the PDL, and the mask 30 includes a light-transmitting area 31 and a light-shielding area 32; the light-transmitting area 31 is aligned to the first portion 21 of the material layer 20; and the light-shielding area 32 is aligned to the second portion 22 of the material layer 20. Therefore, in the first portion 21 of the material layer 20 aligned to the light-transmitting area 31, the property of the photochromic material is converted from light-transmitting to light-shielding via light exposure, and the process that the property of the photochromic material is converted from light-transmitting to light-shielding is irreversible. Meanwhile, the property of the negative photosensitive resin is converted from soluble to insoluble via light exposure, so that the property of the first portion 21 of the material layer 20 is converted from soluble to insoluble via light exposure, and the second portion 22 of the material layer 20 is still soluble as no light exposure is conducted thereto due to the shielding of the light-shielding area 32.

Figure 3:
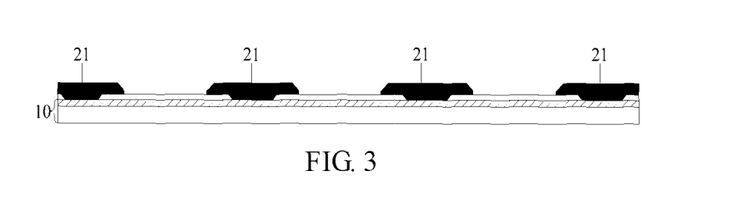

S3: as illustrated in FIG. 3, performing development on the material layer 20, removing the soluble second portion 22 of the material layer 20, retaining the insoluble first portion 21 of the material layer 20, and forming the PDL pattern. As in the first portion 21 of the material layer 20, the property of the photochromic material is converted from light-transmitting to light-shielding via light exposure, and the PDL 40 formed in the step is a light-shielding PDL.

In the steps S1 to S3, as the property of the photochromic material is converted from light-transmitting to light-shielding in the light exposure process of the patterning process, the light-shielding PDL 40 may be directly formed by a patterning process. Thus, the process is simple and the operation is simple.

In the case that the material of forming the PDL is the positive photosensitive resin doped with the photochromic materials, the process of forming the PDL, for instance, may include the following steps:

S1': as illustrated in FIG. 1, allowing the material of forming the PDL to cover the array substrate 10, and forming a material layer 20. The material layer 20 includes a first portion 21 and a second portion 22; the first portion 21 covers the non-pixel regions of the array substrate 10; and the second portion 22 covers the pixel regions of the array substrate.

In the step S1', in the process of preparing the material of forming the PDL, the photochromic material may be added into the positive photosensitive resin and uniformly stirred, so that the photochromic material can be uniformly dispersed in the positive photosensitive resin. The photosensitive resin preferably adopts photosensitive resin with high viscosity, good uniformity and high photosensitivity. The material layer 20 may be formed by allowing the prepared material of forming the PDL to cover the array substrate 10 by a spin-coating process. The thickness of the material layer 20 may preferably be 1.0 µm-1.5 µm, so that the subsequently formed PDL can have good light-shielding property.

Figure 4:
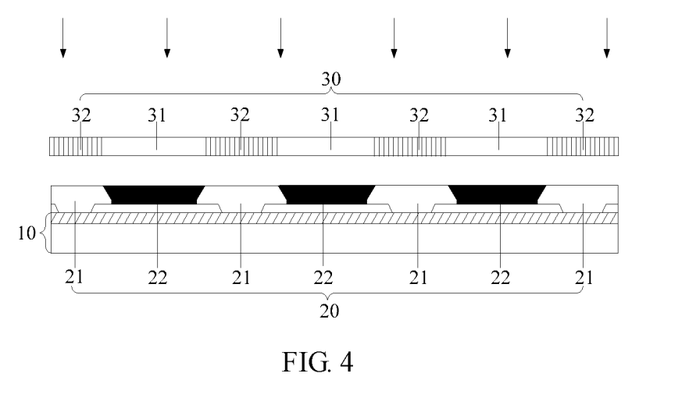

S2': as illustrated in FIG. 4, performing light exposure on the second portion 22 of the material layer 20.

In the step S2', the material layer 20 is subjected to light exposure via a mask 30 provided with a PDL pattern (the arrows in FIG. 4 represent light), and the mask 30 includes a light-transmitting area 31 and a light-shielding area 32; the light-transmitting area 31 is aligned to the second portion 22 of the material layer 20; and the light-shielding area 32 is aligned to the first portion 21 of the material layer 20. Meanwhile, the property of the positive photosensitive resin is converted from insoluble to soluble via light exposure, so that the property of the second portion 22 of the material layer 20 aligned to the light-transmitting areas 31 is converted from insoluble to soluble via light exposure, and the first portion 21 of the material layer 20 are still insoluble as no light exposure is conducted thereto due to the shielding of the light-shielding areas 32.

Figure 5:
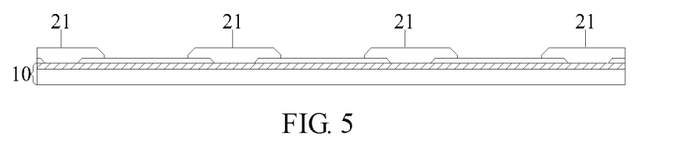

S3': as illustrated in FIG. 5, performing development on the material layer 20, removing the soluble second portion 22 of the material layer, retaining the insoluble first portion 21 of the material layer 20, and forming the PDL pattern.

In the step S3', the soluble second portion 22 of the material layer 20 are removed. Although the first portion 21 of the material layer 20 is retained, the photochromic material in the first portion 21 of the material layer 20 is still light-transmitting as no light exposure is conducted. Thus, the step S4' is additionally provided to form the light-shielding PDL 40.

Figure 6:
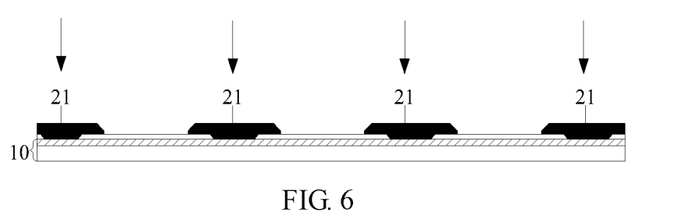

S4': as illustrated in FIG. 6, illuminating the first portion 21 of the material layer 20, so that the property of the first portion 21 of the material layer 20 can be converted from light-transmitting to light-shielding, and the process that the property of the first portion 21 of the material layer 20 is converted from light-transmitting to light-shielding is irreversible.

In the step S4', an additional light source may be adopted to illuminate the PDL pattern formed in the step S3' (the arrows in FIG. 6 represent light), so that the property of the photochromic material in the PDL can be converted from light-transmitting to light-shielding via light illumination, and the process is irreversible. The light-shielding PDL 40 is finally formed (similarly, may refer to FIG. 3).

As can be seen, the step S4' may be an additional step that is executed after the operation of forming the PDL pattern. If the manufactured display substrate is a display substrate provided with an organic light-emitting diode (OLED) structure, the OLED structure may be directly adopted to emit light to illuminate the PDL 40.

Before the description of the case that the OLED structure is adopted to emit light to illuminate the PDL 40, firstly, on the basis of the OLED structure, the method for manufacturing the display substrate provided by the embodiment further comprises the operation of forming an anode layer 50 on the pixel regions of the array substrate 10 before the operation of forming the PDL 40, and further comprises the operations of forming an organic emission layer 60 on the PDL 40 and the anode layer 50 and forming a cathode layer 70 on the organic emission layer 60 after the operation of forming the PDL 40. In the display substrate provided with the OLED structure, the PDL 40 is specifically configured to separate the anode layer 50 in the OLED structure on the display substrate, so that a plurality of relatively independent OLED elements can be formed. Each independent OLED element corresponds to a pixel.

Figure 7:
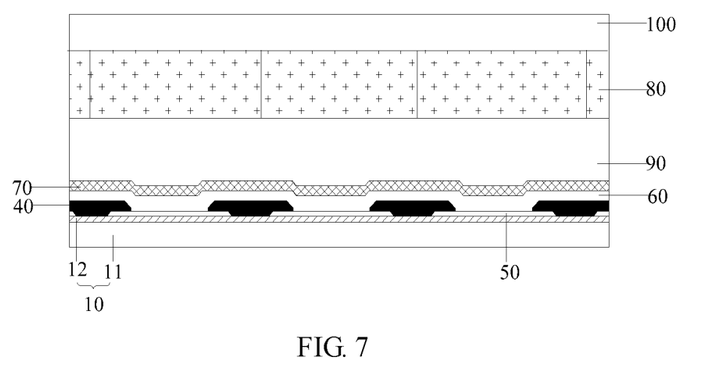
FIG. 7 is a structural sectional view of a display substrate provided by the embodiment of the present disclosure.

As illustrated in FIG. 7, description is given below to the process of forming the OLED structure by taking the process of manufacturing a display substrate provided with a top-emission OLED structure as an example.

An anode layer 50 is formed on the pixel regions of the array substrate 10. For instance, a material layer of the anode layer 50 may be formed by sputtering a high-reflectivity conductive material on the array substrate 10, and subsequently, a pattern of the anode layer 50 is formed by a series of processes such as exposure, development, etching and stripping in the patterning process. As the anode layer 50 is formed by the high-reflectivity material, the formed anode layer 50 has good reflectivity so that can reflect the light emitted by the organic emission layer 60. For instance, the thickness of the anode layer 50 may be 90 nm-100 nm, so that the anode layer 50 can have good electrical property.

The organic emission layer 60 is formed on the PDL 40 and the anode layer 50. For instance, the organic emission layer 60 may be formed by an electroluminescent material through vapor deposition. The thickness of the organic emission layer 60 may be 200 nm-300 nm.

A cathode layer 70 is formed on the organic emission layer 60. For instance, a material layer of the cathode layer 70 may be formed by sputtering a high-transmittance conductive material on the organic emission layer 60, and subsequently, a pattern of the cathode layer 70 is formed by a series of processes such as exposure, development, etching and stripping in the patterning process. As the cathode layer 70 is formed by the high-transmittance material, the cathode layer 70 can have good transmittance, so that light emitted by the organic emission layer 60 can run through the cathode layer 70, and hence a color filter layer on the cathode layer 70 can emit light. For instance, the thickness of the cathode layer 70 may be 100 nm-150 nm, so that the cathode layer 70 can have good electrical property.

In the display substrate provided with the OLED structure, in the working process, the anode layer 50 and the cathode layer 70 are electrically connected to a power source, so that the organic emission layer 60 between the anode layer 50 and the cathode layer 70 can emit light, and hence light emitted by the organic emission layer 60 can irradiate the PDL 40 below the organic emission layer 60. When the material of forming the PDL 40 is the positive photosensitive resin doped with the photochromic material, the first portion 21 of the material layer 20 for forming the PDL 40 are irradiated by the organic emission layer 60, so that the property of the photochromic material can be converted from light-transmitting to light-shielding, and hence the light-shielding PDL 40 can be formed. Therefore, the operation of irradiating the first portion 21 of the material layer 20 via an additional light source can be eliminated, and hence the manufacturing process of the display substrate is simplified.

Of course, the PDL 40 formed by the negative photosensitive resin is also applicable to the display substrate provided with the OLED structure.

A method for manufacturing a color filter on array (COA) substrate provided with a top-emission OLED structure may further comprise: forming a color filter layer 80 on the cathode layer 70. For instance, the thickness of the color filter layer 80 may be 2.5 µm-3.0 µm, so that light running through the color filter layer 80 can have good color purity.

In order to reduce the influence of moisture and oxygen in the air on the service life of the organic emission layer 60 in the OLED structure, a thin-film encapsulation layer 90 may be formed between the cathode layer 70 and the color filter layer 80. For instance, the thickness of the thin-film encapsulation layer 90 is 3.0 µm-3.5 µm, so that the organic emission layer 60 can be isolated and protected.

Moreover, in order to protect the OLED structure and the color filter layer 80, a second encapsulation layer 100 may be formed on the color filter layer 80. For instance, the thickness of the second encapsulation layer 100 is 3.0 µm-3.5 µm.

Figure 8:
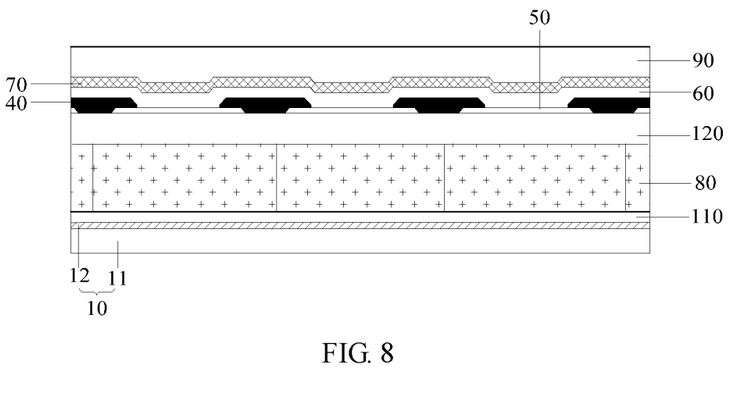
FIG. 8 is a structural sectional view of another display substrate provided by the embodiment of the present disclosure.

The OLED structure on the display substrate may also be a bottom-emission OLED structure. The method for manufacturing the display substrate is different from the method for manufacturing the display substrate provided with the top-emission OLED structure. As illustrated in FIG. 8, before the operation of forming the anode layer 50, firstly, a color filter layer 80 is formed on the pixel regions of the array substrate 10. For instance, the thickness of the color filter layer 80 may be 2.5 µm-3.0 µm, so that light running through the color filter layer 80 can have good color purity. In order to isolate a TFT array 12 and the color filter layer 80, a passivation layer 110 may be formed on the array substrate 10 before the operation of forming the color filter layer 80. In order to improve the layer quality of the OLED structure, a planarization layer 120 may be formed on the color filter layer 80 after the operation of forming the color filter layer 80. After the operation of forming the planarization layer 120, the operations of forming an anode layer 50, an organic emission layer 60 and a cathode layer 70 of the OLED structure are sequentially executed. It should be noted that the anode layer 50 runs through a via hole formed in the planarization layer 120, the color filter layer 80 and the passivation layer 110 and is electrically connected with the TFT array 12 of the array substrate 10.

In the process of manufacturing the display substrate provided with the bottom-emission OLED structure, the cathode layer 70 may be formed by a high-reflectivity material, so that the cathode layer 70 can have good reflectivity, and hence light emitted by the organic emission layer 60 can be reflected to the inside of the display substrate. Meanwhile, the anode layer 50 may be formed by a high-transmission material, so that the anode layer 50 can have good transmittance, and hence the light emitted by the organic emission layer 60 and the light returned to the inside of the display substrate by the cathode layer 70 can run through the anode layer 50, reach the color filter layer 80 below the OLED structure, and finally be emitted from the array substrate 10 of the display substrate.

It should be noted that the property of the photochromic material in the embodiment can be converted from light-transmitting to light-shielding under the action of light illumination. The color with good light-shielding effect is preferably black. Therefore, for instance, the photochromic material may become black under the action of light illumination.

With reference to the proposal that the photochromic material may become black under the action of light illumination, for instance, photosensitive silver halide may be adopted. Silver halide may be subjected to a decomposition reaction to generate elemental silver under the action of light illumination. The elemental silver is black. Meanwhile, silver halide is light-colored in normal state and is light-transmitting, so that the light exposure process can be successfully finished. Thus, silver halide may be taken as the photochromic material in the embodiment. Moreover, in order to allow silver halide to be uniformly distributed in the material of forming the PDL, silver halide particles may be preferably adopted. Silver halide particles are added into the photosensitive resin and fully stirred, so that uniformly dispersed emulsifier can be formed by the silver halide particles and the photosensitive resin, and hence the silver halide particles can be uniformly distributed in the photosensitive resin. After the material layer is formed, a light source irradiates the material layer containing the silver halide particles, the uniformly distributed silver halide particles can fully and comprehensively sense light, so that the formed PDL can turn black for light-shielding. In addition, the silver halide particles also have high-temperature resistance and are still stable in the process condition of 230° C. Therefore, in the manufacturing process of the display substrate, the properties of the silver halide particles cannot be changed due to the influence of other high-temperature processes.

Second Embodiment

The embodiment of the present disclosure provides a display substrate. As illustrated in FIGS. 7 and 8, the display substrate comprises an array substrate 10 and a PDL 40 uniformly distributed with photochromic material. The PDL 40 is disposed on non-pixel regions of the array substrate 10. Moreover, the property of the photochromic material can be converted from light-transmitting to light-shielding under the action of light illumination, so that the property of the PDL provided with the photochromic material can be converted from light-transmitting to light-shielding under the action of light illumination. The process that the property of the PDL is converted from light-transmitting to light-shielding is irreversible.

As the photochromic material are uniformly distributed in the PDL 40 of the display substrate and the property of the photochromic material can be converted from light-transmitting to light-shielding under the action of light illumination, in the process of forming the PDL of the display substrate, a PDL pattern may be formed, the light used for exposure in the patterning process can pass through the originally light-transmitting photochromic material, and in the meantime, the property of the photochromic material can be converted into light-shielding via light illumination, so that the property of the PDL provided with the photochromic material can be converted into light-shielding. Meanwhile, the process that the property of the PDL is converted from light-transmitting to light-shielding is irreversible, so the finally formed PDL can have light-shielding function. The light-shielding PDL may be adopted to replace a black matrix.

As can be seen, in the display substrate, the light-shielding PDL can be formed by a simple patterning process and replace the black matrix, so that the layer structure of the array substrate can be simplified. Therefore, the problem of reduced aperture ratio caused by the complex layer structure of the array substrate in the case that the CFs are formed on the array substrate can be avoided, and the aperture ratio of the display substrate can be improved. Moreover, as the light-shielding PDL replaces the black matrix, the forming process of the black matrix can be eliminated, so that the manufacturing process of the display substrate can be simplified. Meanwhile, as at least one layer structure of the display substrate is reduced, the thickness of the display substrate is reduced, which satisfies the light and thin requirement on the display device.

According to the characteristic that the photochromic material can be converted from light-transmitting to light-shielding under the action of light illumination, preferably, the photochromic material may adopt silver halide particles. The silver halide particles are light-colored in normal state and are light-transmitting. Under the action of light illumination, the silver halide particles can be subjected to decomposition reaction to generate black silver nano-microcrystal. Black color can have light-shielding function.

As illustrated in FIGS. 7 and 8, the display substrate is particularly applicable to an OLED display device. In this case, the display substrate further comprises an OLED structure. The display substrate, for instance, comprises: an array substrate formed by a base substrate 11 and a TFT array 12 on the base substrate 11; an anode layer 50 disposed on the pixel region of the array substrate 10, a PDL 40 disposed on non-pixel regions of the array substrate 10, an organic emission layer 60 disposed on the anode layer 50 and the PDL 40, and a cathode layer 70 disposed on the organic emission layer 60, in which the OLED structure is formed by the anode layer 50, the organic emission layer 60 and the cathode layer 70; and a thin-film encapsulation layer 90 disposed on the OLED structure.

As illustrated in FIG. 7, the OLED structure in the display substrate of the OLED display device may be a top-emission OLED structure. Correspondingly, the display substrate further comprises: a color filter layer 80 disposed on the cathode layer 70 of the OLED structure. The color filter layer 80 is correspondingly disposed on the pixel regions of the array substrate 10 and includes red (R), green (G) and blue (B) color filters. In order to protect the organic emission layer 60 of the OLED structure, a thin-film encapsulation layer 90 may be disposed between the color filter layer 80 and the cathode layer 70 of the OLED structure. In order to protect the color filter layer 80, a second encapsulation layer 100 may further be disposed on the color filter layer 80.

As illustrated in FIG. 8, the OLED structure in the display substrate of the OLED display device may also be a bottom-emission OLED structure. Correspondingly, the display substrate further comprises: a color filter layer 80 disposed between the array substrate 10 and the anode layer 50 of the OLED structure. The color filter layer 80 is correspondingly disposed on the pixel regions of the array substrate 10 and includes R, G and B color filters. In order to isolate the TFT array 12 of the array substrate 10 and the color filter layer 80, a passivation layer 110 may be disposed between both. In order to flatten the surface of the color filter layer 80, a planarization layer 120 may be disposed on the color filter layer 80. The anode layer 50 of the OLED structure runs through the via holes formed in the planarization layer 120, the color filter layer 80 and the passivation layer 110 and is electrically connected with the array substrate 10.

Third Embodiment

The embodiment of the present disclosure provides a display device, which comprises the display substrate provided by the second embodiment.

In the display substrate of the display device, the photochromic material are uniformly distributed in the PDL. The property of the photochromic material can be converted from light-transmitting to light-shielding under the action of light illumination, so that the formed PDL can have light-shielding function only via light exposure, illumination, or the like. Thus, in the display device, the light-shielding PDL can be formed by a simple patterning process and replace a black matrix, so that the layer structure of the display substrate can be simplified. Therefore, the problem of reduced aperture ratio in the case that the color filters are formed on the array substrate can be avoided, and the aperture ratio of the display device can be improved. Meanwhile, the forming process of the black matrix can also be eliminated, so that the manufacturing process of the display device can be simplified.

It should be noted that the display device provided by the embodiment may be any product or component with display function such as an OLED panel, an LCD panel, an e-paper display panel, a mobile phone, a tablet PC, a TV, a display, a notebook computer, a digital picture frame and a navigator.

What are described above is related to the illustrative embodiments of the disclosure only and not limitative to the scope of the disclosure; the scopes of the disclosure are defined by the accompanying claims.

The application claims priority to the Chinese patent application No. 201610009787.7, filed Jan. 7, 2016, the entire disclosure of which is incorporated herein by reference as part of the present application.

What is claimed is:

1. A method for manufacturing a display substrate, comprising:
   forming a thin-film transistor (TFT) array on a base substrate to form an array substrate; and
   forming a pixel define layer (PDL) on a non-pixel region of the array substrate by a patterning process,
   wherein forming the PDL comprises:
      providing a material of forming the PDL, wherein the material of forming the PDL comprises a photosensitive resin and a photochromic material distributed in the photosensitive resin;
      coating the material, comprising the photosensitive resin and the photochromic material, of forming the PDL on the array substrate to form a material layer; and
      performing light exposure on a portion, which is used for forming the PDL, of the material layer to form the PDL, wherein the photochromic material in the portion, which is used for forming the PDL, of the material layer is converted from light-transmitting to light-shielding under action of light illumination, so that the PDL is converted from light-transmitting to light-shielding,
      wherein the process that the photochromic material in the portion, which is used for forming the PDL, of the material layer is converted from light-transmitting to light-shielding under action of light illumination is irreversible.

2. The method for manufacturing the display substrate according to claim 1, wherein
   before forming the PDL, the manufacturing method further comprises: forming an anode layer on a pixel region of the array substrate; and
   after forming the PDL, the manufacturing method further comprises: forming an organic emission layer on the PDL and the anode layer, and forming a cathode layer on the organic emission layer.

3. The method for manufacturing the display substrate according to claim 2, wherein the photosensitive resin is a negative photosensitive resin; and
   an operation of forming the PDL includes:
   forming a material layer by allowing the material of forming the PDL to cover the array substrate, in which the material layer includes a first portion and a second portion, the first portion covers the non-pixel region of the array substrate, and the second portion covers the pixel region of the array substrate;
   performing light exposure on the first portion of the material layer, in which during exposure, the photochromic material in the first portion of the material layer is converted from light-transmitting to light-shielding so that the first portion of the material layer is converted from light-transmitting to light-shielding, and the process that the first portion of the material layer is converted from light-transmitting to light-shielding is irreversible; and
   performing development on the material layer and removing the second portion of the material layer.

4. The method for manufacturing the display substrate according to claim 2, wherein the photosensitive resin is a positive photosensitive resin; and
   an operation of forming the PDL includes:
   forming a material layer by allowing the material of forming the PDL to cover the array substrate, in which the material layer includes a first portion and a second portion, the first portion covers the non-pixel region of the array substrate, and the second portion covers the pixel region of the array substrate;
   performing light exposure on the second portion of the material layer;
   performing development on the material layer and removing the second portion of the material layer; and
   illuminating the first portion of the material layer, wherein during illumination, the photochromic material in the first portion of the material layer is converted from light-transmitting to light-shielding, so that the first portion of the material layer is converted from light-transmitting to light-shielding, and the process that the first portion of the material layer is converted from light-transmitting to light-shielding is irreversible.

5. The method for manufacturing the display substrate according to claim 4, wherein an operation of illuminating the first portion of the material layer so that the first portion of the material layer is converted from light-transmitting to light-shielding includes:
   electrically connecting the anode layer and the cathode layer to a power source, and allowing the organic emission layer to emit light and the light emitted by the organic emission layer to irradiate the first portion of the material layer.

6. The method for manufacturing the display substrate according to claim 2, wherein before forming the anode layer, the manufacturing method further comprises forming a color filter layer on the pixel regions of the array substrate; or
   after forming the cathode layer, the manufacturing method further comprises forming a color filter layer on the pixel regions of the array substrate.

7. The method for manufacturing the display substrate according to claim 1, wherein the photochromic material become black under action of light illumination.

8. The method for manufacturing the display substrate according to claim 1, wherein the photochromic material comprises silver halide particles.

9. The method for manufacturing the display substrate according to claim 1, wherein a thickness of the PDL is 1.0 μm-1.5 μm.

10. A display substrate, comprising:
    an array substrate; and
    a pixel define layer (PDL) disposed on a non-pixel region of the array substrate,
    wherein the PDL comprises a photosensitive resin and a photochromic material distributed in the photosensitive resin;
    the photochromic material is converted from light-transmitting to light-shielding under action of light illumination, so that the PDL is converted from light-transmitting to light-shielding; and
    a property that the photochromic material in the PDL is converted from light-transmitting to light-shielding is irreversible, the PDL provided with the photochromic material is converted from light-transmitting to light-shielding under action of light illumination, and the process that a property of the PDL is converted from light-transmitting to light-shielding is irreversible.

11. The display substrate according to claim 10, wherein the photochromic material comprises silver halide particles.

12. The display substrate according to claim 10, further comprising:
- an anode layer disposed between the array substrate and the PDL, in which the anode layer is disposed in a pixel region of the array substrate;
- an organic emission layer disposed on the PDL and the anode layer; and
- a cathode layer disposed on the organic emission layer.

13. The display substrate according to claim 12, further comprising:
- a color filter layer disposed between the array substrate and the anode layer, in which the color filter layer is disposed in the pixel region of the array substrate; or
- a color filter layer disposed on the cathode layer, in which the color filter layer is disposed in the pixel region of the array substrate.

14. A display device, comprising the display substrate according to claim 10.

* * * * *